United States Patent
Jung (10) Patent No.: US 8,169,828 B2
(45) Date of Patent: May 1, 2012

(54) SEMICONDUCTOR MEMORY CELL, METHOD FOR MANUFACTURING THE SAME AND METHOD FOR OPERATING THE SAME

(75) Inventor: Jin-Hyo Jung, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 260 days.

(21) Appl. No.: 12/641,223

(22) Filed: Dec. 17, 2009

(65) Prior Publication Data

US 2010/0165746 A1 Jul. 1, 2010

(30) Foreign Application Priority Data

Dec. 30, 2008 (KR) ........................ 10-2008-0136820

(51) Int. Cl.
*G11C 16/04* (2006.01)

(52) U.S. Cl. ......... 365/185.18; 365/185.24; 365/185.26; 365/185.28; 365/185.29; 365/185.27

(58) Field of Classification Search ............. 365/185.18, 365/185.24, 185.26, 185.28, 185.29, 185.27
See application file for complete search history.

(56) References Cited

U.S. PATENT DOCUMENTS

| | | | | |
|---|---|---|---|---|
| 5,386,132 A | * | 1/1995 | Wong ............................ | 257/316 |
| 5,457,652 A | * | 10/1995 | Brahmbhatt ............. | 365/185.27 |
| 5,986,931 A | * | 11/1999 | Caywood .................. | 365/185.06 |
| 6,212,103 B1 | * | 4/2001 | Ahrens et al. ........... | 365/185.29 |
| 6,731,544 B2 | * | 5/2004 | Han et al. .................. | 365/185.28 |
| 6,747,899 B2 | * | 6/2004 | Hsia et al. ................. | 365/185.28 |
| 6,778,438 B2 | * | 8/2004 | Hung et al. .............. | 365/185.17 |
| 7,177,190 B2 | * | 2/2007 | Lee .......................... | 365/185.17 |
| 7,430,137 B2 | * | 9/2008 | Greene et al. ........... | 365/185.05 |
| 7,528,436 B2 | * | 5/2009 | Georgescu et al. ........... | 257/314 |

* cited by examiner

*Primary Examiner* — Viet Q Nguyen
(74) *Attorney, Agent, or Firm* — Sherr & Vaughn, PLLC

(57) ABSTRACT

A semiconductor memory cell, and method of manufacturing a semiconductor memory cell and an method of operating a semiconductor memory cell. A method of operating may include programming a semiconductor memory cell by applying a preset programming voltage to a common source and/or an N-well region, grounding and/or floating a control gate, and/or grounding a word line and/or a bit line. A method of operating may include erasing a semiconductor memory cell by floating and/or grounding a word line, applying a preset erase voltage to a control gate, and/or grounding an N-well, a bit line and/or a common source. A method of operating may include reading a semiconductor memory cell by grounding and/or floating a control gate, applying a preset read voltage to an N-well and/or a common source, grounding a word line, and/or applying a preset drain voltage to a bit line.

6 Claims, 9 Drawing Sheets

| Operation | WL1 | WL2 | CG | BL1 | BL1 | Vb(NW) | Vs | Comment |
|---|---|---|---|---|---|---|---|---|
| PGM (CHEI) | +vP | 0V (GND) | 0V (GND) or Floating | 0V (GND) | +Vp | +Vp | +Vp | Byte(WL) UNIT Program |
| ERS (FNT) | Floating or 0V (GND) | Floating or 0V (GND) | +Ve | 0V (GND) | 0V (GND) | 0V (GND) | 0V (GND) | Block UNIT Erase |
| READ | READ | 0V (GND) | 0V (GND) or Floating | +Vd | +Vr | +Vr | +Vr | Byte(WL) UNIT Read(+Vr>+Vd) |

| Operation | WL1 | WL2 | CG | BL1 | BL1 | Vb(NW) | Vs | Comment |
|---|---|---|---|---|---|---|---|---|
| PGM (CHEI) | +vP | 0V (GND) | 0V (GND) or Floating | 0V (GND) | +Vp | +Vp | +Vp | Byte(WL) UNIT Program |
| ERS (FNT) | Floating or 0V (GND) | Floating or 0V (GND) | +Ve | 0V (GND) | 0V (GND) | 0V (GND) | 0V (GND) | Block UNIT Erase |
| READ | READ | 0V (GND) | 0V (GND) or Floating | +Vd | +Vr | +Vr | +Vr | Byte(WL) UNIT Read(+Vr)>+Vd |

SEMICONDUCTOR MEMORY CELL, METHOD FOR MANUFACTURING THE SAME AND METHOD FOR OPERATING THE SAME

The present application claims priority under 35 U.S.C. 119 to Korean Patent Application No. 10-2008-0136820 (filed on Dec. 30, 2008) which is hereby incorporated by reference in its entirety.

BACKGROUND

Embodiments relate to a semiconductor memory cell and methods thereof. Some embodiments relate to a semiconductor memory cell which may be used in a circuit including a silicon substrate biased to a negative potential in a single poly electrically erasable programmable read-only memory (EEPROM) cell, a method of manufacturing the same and/or a method of operating the same.

Figure 1A:
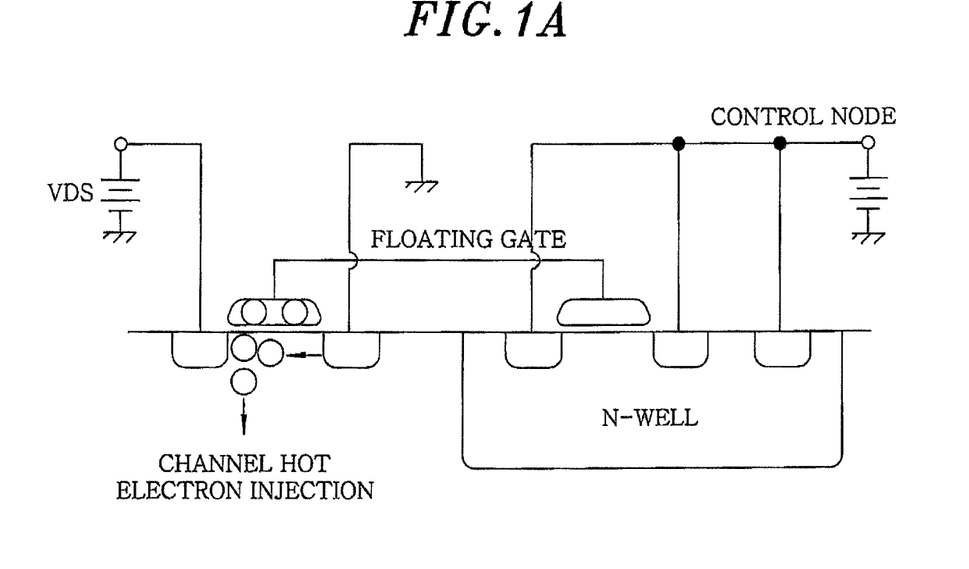
FIG. 1A is a view illustrating a programming scheme in a electrically erasable programmable read-only memory (EEPROM).
Figure 1B:
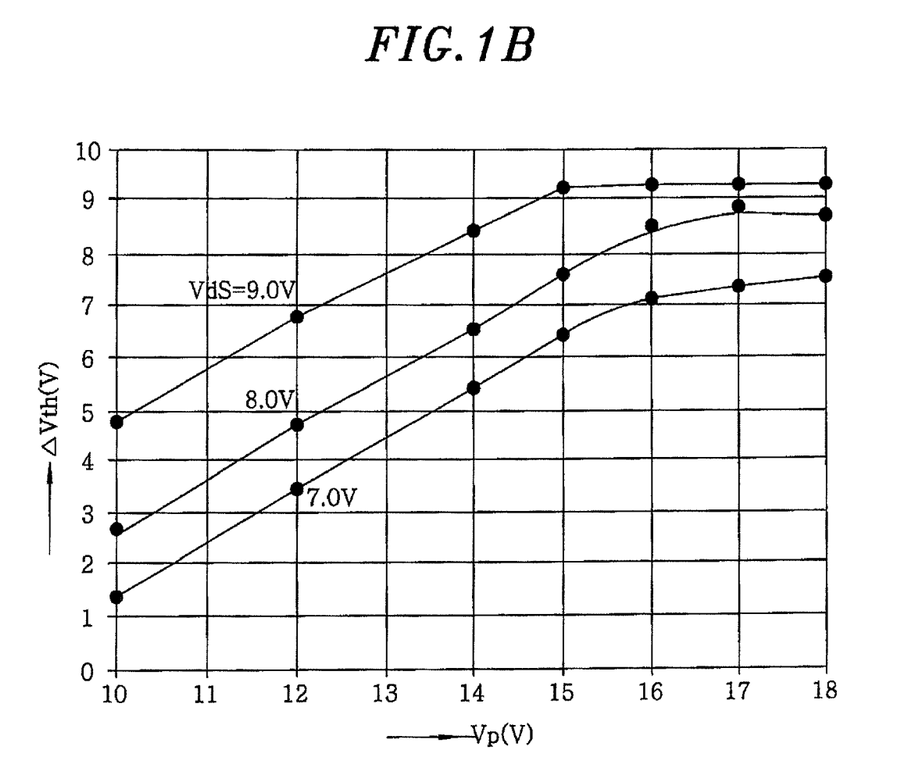
FIG. 1B is a view illustrating a change in a threshold voltage of an N metal oxide semiconductor (NMOS) device.
Figure 1C:
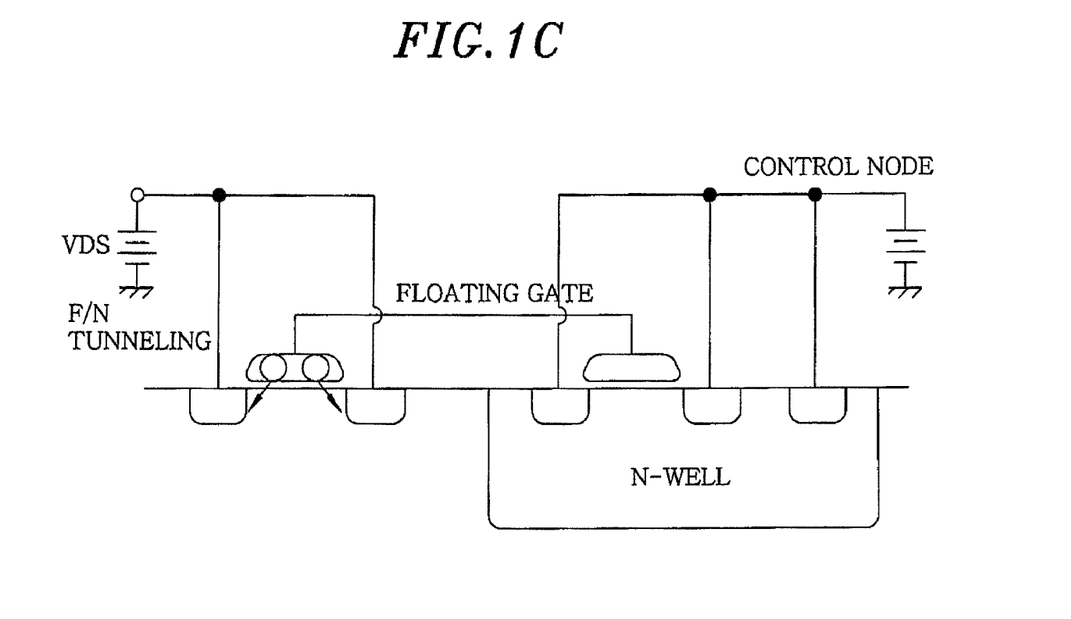
FIG. 1C is a view illustrating an erase scheme in an EEPROM.

Referring to example FIG. 1A to FIG. 1C, a single poly EEPROM cell structure is illustrated. A channel hot electron injection scheme may include a particular voltage induced to a floating gate by program voltage +Vp applied to an N-well. A voltage induced to a floating gate may be defined by a coupling ratio. A channel region of an N metal oxide semiconductor (NMOS) may be inverted by a particular voltage induced to a floating gate. Particular voltage VDS may be applied to a drain region of an NMOS, such that current may flow from a drain region toward a source region. Channel hot electrons may be produced in the vicinity of a drain junction region, which may be injected into a floating gate and/or which may result in a relative increase in a threshold voltage of an NMOS device, as illustrated in FIG. 1B.

Figure 1D:
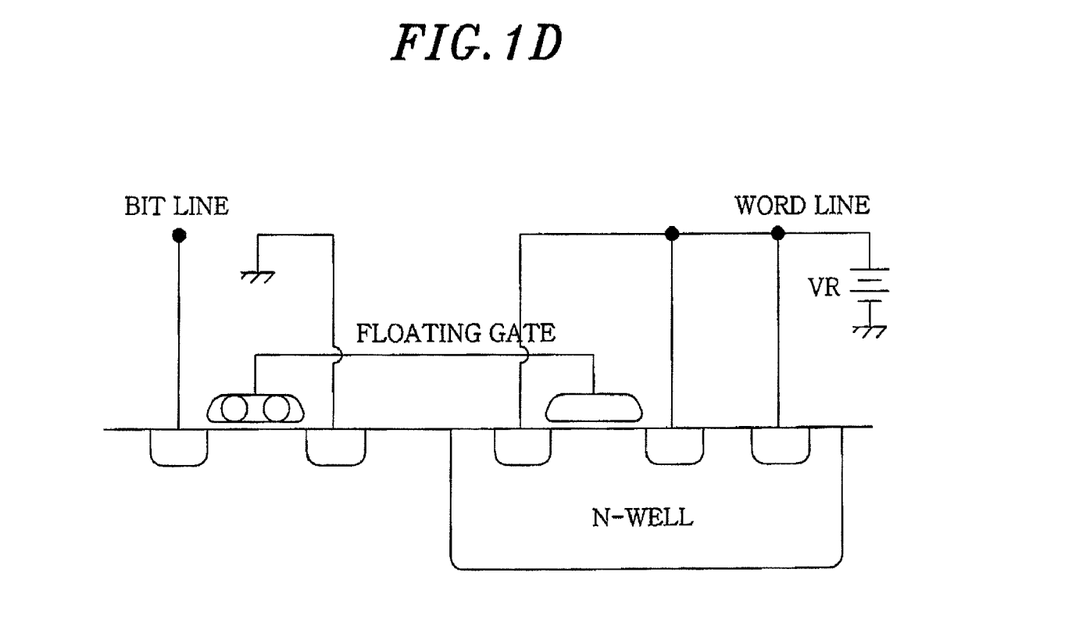
FIG. 1D is a view illustrating a read scheme in an EEPROM.

Referring to FIG. 1C, a view illustrates an erase scheme in a EEPROM according to a Fower-Nordheim (F/N) tunneling method. An N-well may be grounded and/or erase voltage +VE may be applied to a source/drain region of an NMOS. A potential approximating to a ground voltage may be induced to a floating gate by a ground voltage applied to a N-well, and/or an electric field may be relatively strongly biased from a source/drain region of an NMOS toward a floating gate by erase voltage +VE applied to a source/drain region of an NMOS. Electrons existing in a floating gate may be F/N-tunneled by an electric field applied, which may escape into a source/drain region, and/or which may result in a low threshold voltage of an NMOS. Referring to FIG. 1D, a reading operation of a EEPROM is illustrated. Teading voltage +VR may be applied to an N-Well. A particular voltage may be induced to a floating gate. A positive drain voltage, for example, to read may be applied to a drain of an NMOS device. A source of an NMOS device may be grounded.

However, if a threshold voltage of an NMOS device is relatively very high under a programming condition where electrons may be injected in a floating gate, substantially no current may flow since a particular voltage induced to a floating gate may not turn an NMOS device on. In an erase condition where substantially no electrons may be present in a floating gate, current may flow even when a particular voltage induced to a floating gate in a state where a threshold voltage of an NMOS device may be relatively very low may turn an NMOS device on. In a single poly EEPROM, since an N-well may have to be formed to induce a particular potential to a floating gate to program, erase and/or read, a unit cell area may become relatively very large. It may be relatively difficult to implement EEPROM having a high density.

SUMMARY

Embodiments relate to an electrically erasable programmable read-only memory (EEPROM) cell structure and methods thereof. According to embodiments, a single poly EEPROM cell structure may include a poly EEPROM cell which may be scaled to a level of a stack gate poly EEPROM cell by forming a contact to couple to a floating gate polysilicon, forming a dielectric film to couple a contact and a floating gate polysilicon, and/or performing a coupling through a floating gate polysilicon and a contact. In embodiments, methods of performing programming, erasing and/or reading operations may be provided, for example for a semiconductor memory cell including a floating gate polysilicon and/or a dielectric which may be used to couple, for example formed between a contact and a floating gate polysilicon.

According to embodiments, a method of manufacturing a semiconductor memory cell may include preparing a semiconductor substrate having an N-well region. In embodiments, a method manufacturing a semiconductor memory cell may include forming a floating gate polysilicon on and/or over a semiconductor substrate having an N-well region. In embodiments, a method of manufacturing a semiconductor memory cell may include forming a contact on and/or over a floating gate polysilicon. In embodiments, a method of manufacturing a semiconductor memory cell may include forming a dielectric between a contact and a floating gate polysilicon.

According to embodiments, a semiconductor memory cell may include a semiconductor substrate having an N-well region. In embodiments, a semiconductor memory cell may include a control gate line formed on and/or over a semiconductor substrate. In embodiments, a semiconductor memory cell may include a floating gate polysilicon formed on and/or over a semiconductor substrate. In embodiments, a semiconductor memory cell may include a contact formed on and/or over a floating gate polysilicon, such that a contact may be connected with a control gate line. In embodiments, a semiconductor memory cell may include and a dielectric formed between a contact and a floating gate polysilicon.

According to embodiments, a method of operating a semiconductor memory cell may include a semiconductor memory cell having a floating gate formed on and/or over a semiconductor substrate including an N-well region and/or under a bit line, a word line formed under a floating gate, a common source formed under a word line, and/or a control gate connected to a floating gate by a contact using a dielectric.

According to embodiments, a method of operating a semiconductor memory cell may include programming a semiconductor memory cell. In embodiments, a method of operating a semiconductor memory cell may include applying a preset programming voltage to a common source and/or an N-well region. In embodiments, a method of operating a semiconductor memory cell may include grounding and/or floating a control gate. In embodiments, a method of operating a semiconductor memory cell may include grounding a word line and/or a bit line.

According to embodiments, a method of operating a semiconductor memory cell may include erasing a semiconductor memory cell. In embodiments, a method of operating a semiconductor memory cell may include floating and/or grounding a word line. In embodiments, a method of operating a semiconductor memory cell may include applying a preset erase voltage to a control gate. In embodiments, a method of operating a semiconductor memory cell may include grounding an N-well, a bit line and/or a common source.

According to embodiments, a method of operating a semiconductor memory cell may include reading a semiconductor memory cell. In embodiments, a method of operating a semiconductor memory cell may include grounding and/or floating a control gate. In embodiments, a method of operating a semiconductor memory cell may include applying a preset read voltage to a N-well and/or a common source. In embodiments, a method of operating a semiconductor memory cell may include grounding a word line. In embodiments, a method of operating a semiconductor memory cell may include applying a preset drain voltage to a bit line.

According to embodiments, it may be possible to implement a relatively high-density single poly EEPROM cell by scaling a single poly EEPROM cell to a level of a stack gate poly EEPROM cell, for example by forming a contact to couple to a floating gate polysilicon, and/or forming a dielectric film to couple a contact and a floating gate polysilicon.

DRAWINGS

Example

Example

Example

Example

Example

Example

Example

Example

Example

Example

Example

DESCRIPTION

Embodiments relate to a semiconductor memory cell, and method of manufacturing a semiconductor memory cell and an method of operating a semiconductor memory cell. Referring to example FIG. 2, a plane view illustrates a semiconductor memory cell, for example a single poly EEPROM cell array applied in accordance with embodiments. Referring to example FIG. 3, a view illustrates vertical profiles when a unit cell of a single poly EEPROM of in accordance with embodiments may be cut in directions A, B and C.

Figure 2:
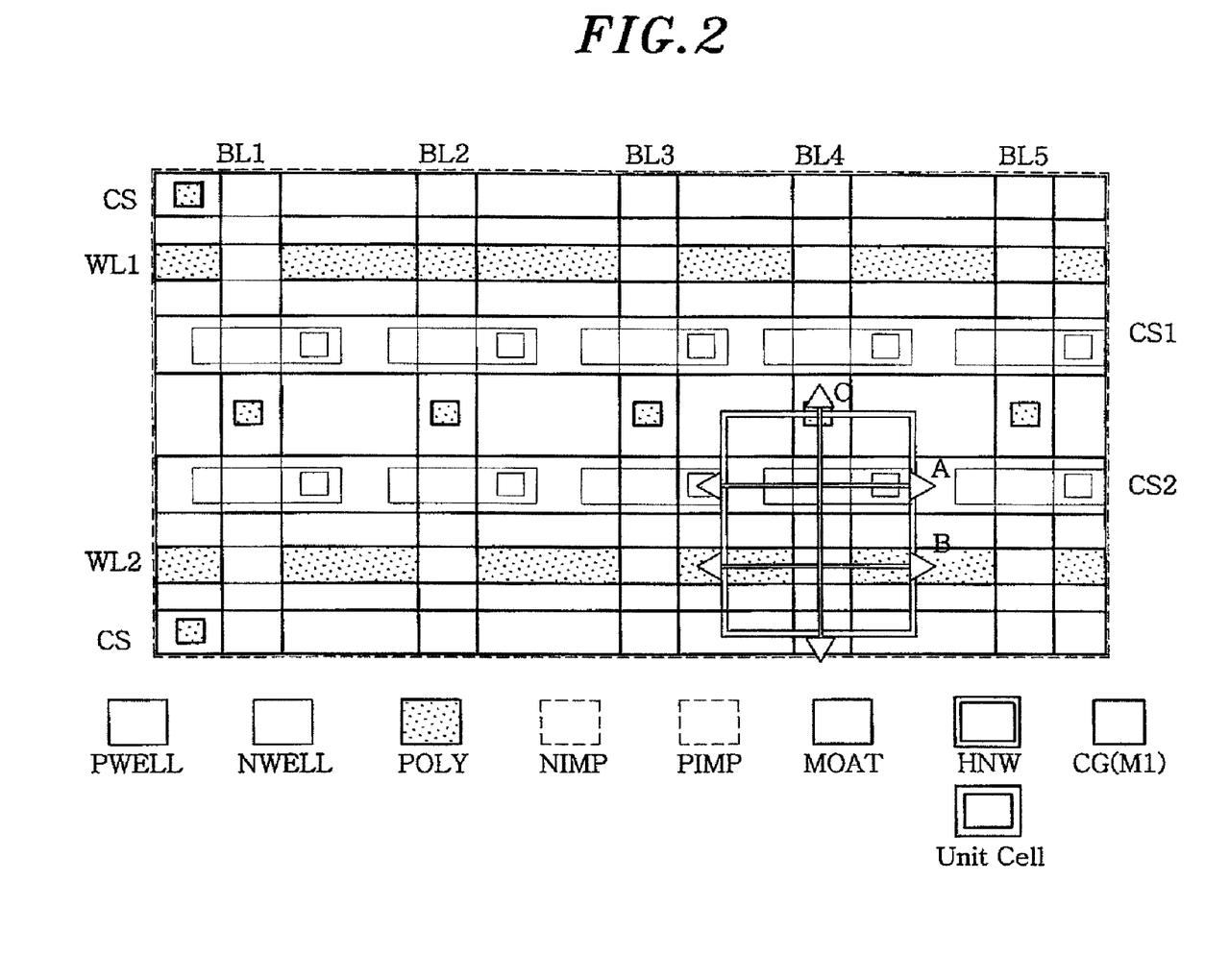
FIG. 2 is a plane view illustrating a single poly EEPROM cell array in accordance with embodiments.

Referring to a unit cell illustrated in FIG. 2, a floating poly gate may exists under a bit line contact, for example, BL4. According to embodiments, a poly gate corresponding to a word line, for example WL2, may traverse below a floating poly gate. In embodiments, a common source, for example CS, may be located below a word line poly gate. In embodiments, a contact may be formed in a floating gate, and/or a contact formed in a floating gate may be connected to a control gate line, for example CG, in a direction of a polysilicon for word line.

Figure 3:
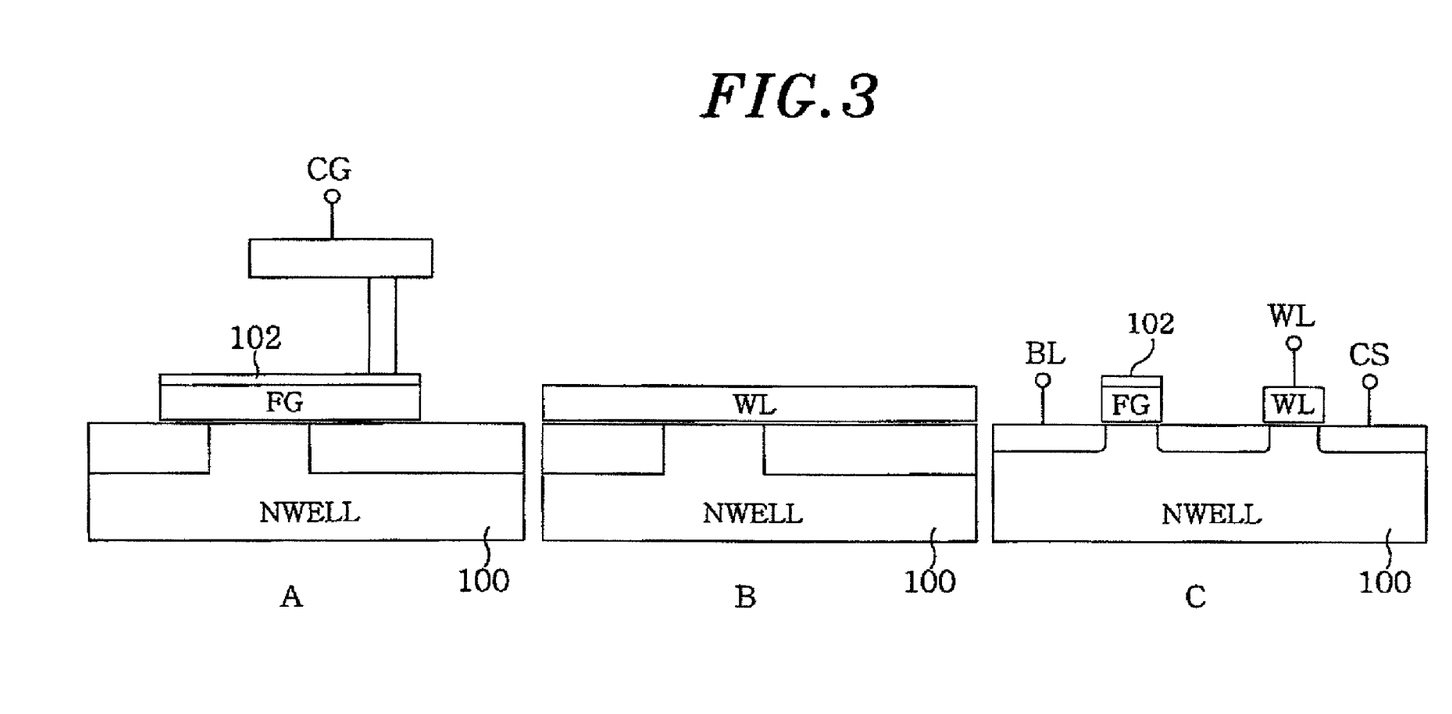
FIG. 3 is a view illustrating sections in directions A, B and C of a single poly EEPROM cell array illustrated in FIG. 2 in accordance with embodiments.

According to embodiments, as indicated by "A" in FIG. 2 and illustrated in example FIG. 3, a contact formed in a floating gate may not be connected as an ohmic contact to a floating gate, for example FG. In embodiments, dielectric 102 may be located between a contact and floating gate FG, which may operate as a poly to contact capacitor. In embodiments, dielectric 102 may include a single film such as silicon oxide (SiO2), silicon nitride (SiN) and/or silicon oxynitride (SiON). In embodiments, dielectric 102 may include a sandwich structure such as oxide-nitride, nitride-oxide, oxide-nitride-oxide (ONO), and the like. In embodiments, a surface, which may include an entire surface of floating gate FG, may be covered by a dielectric. In embodiments, a dielectric may be formed on and/or over a partial region in which a contact may be formed. In embodiments, a source/drain region may be formed by injecting P-type impurities.

Figure 4:
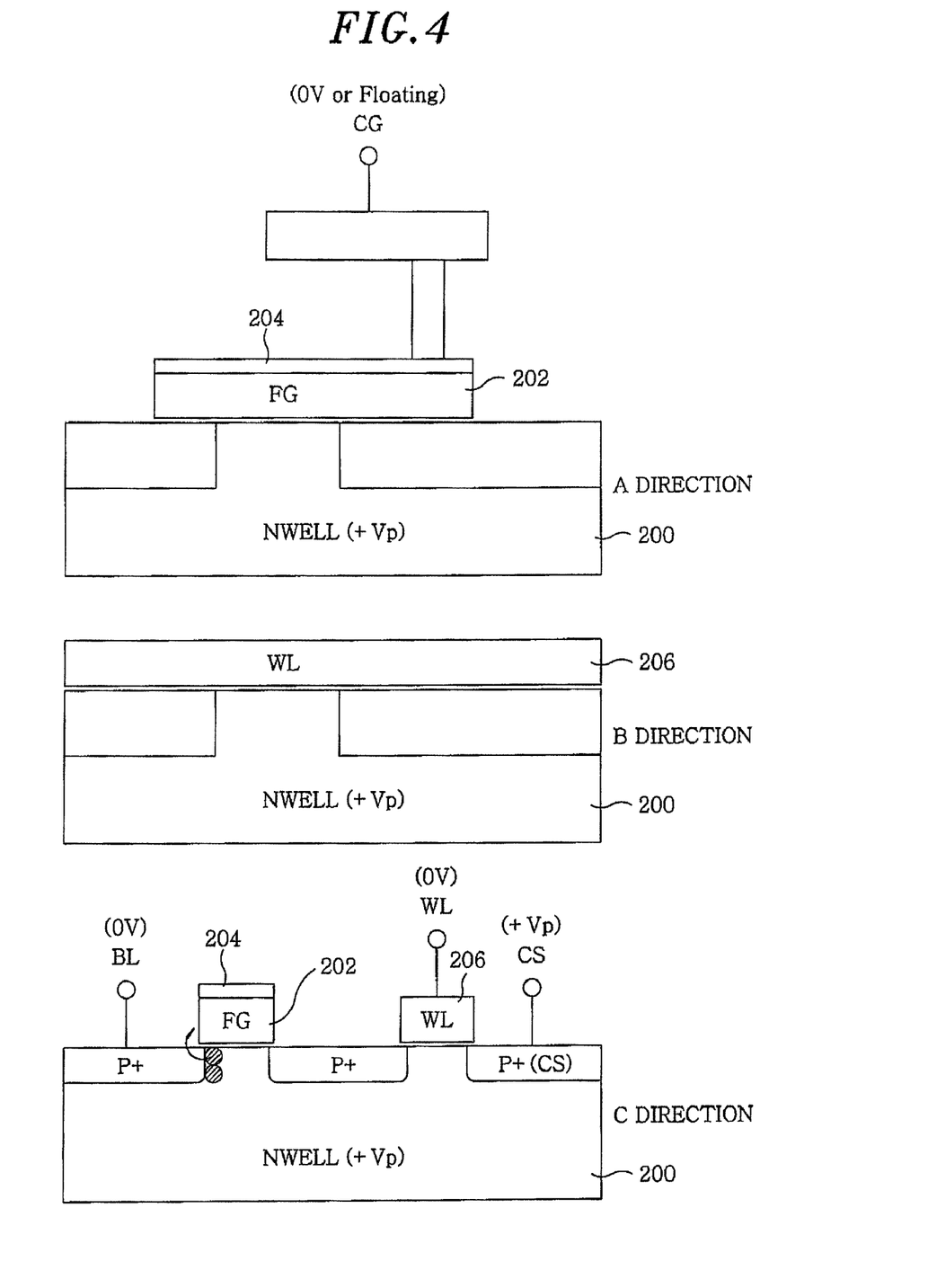
FIG. 4 is a view illustrating a program scheme in a single poly EEPROM in accordance with embodiments.

Referring to example FIG. 4, a view illustrates a method of programming a single poly EEPROM cell in accordance with embodiments. According to embodiments, programming voltage +Vp may be applied to common source CS and/or N-well 200. In embodiments, control gate CG may be grounded, for example at approximately 0 V, and/or floated. In embodiments, remaining terminals, for example word line WL and/or bit line BL, may be grounded, for example at approximately 0 V. In embodiments, an area of a capacitor formed on and/or over a floating gate and/or under a line contact of a control gate CG may be relatively very small compared to an area formed between floating gate FG, N-well 200 and/or a source/drain. In embodiments, capacitance between floating gate EG and control gate CG line contact may be relatively very small. In embodiments, a potential induced to floating gate FG may depend on a potential applied to N-well 200 and a source/drain.

According to embodiments, a voltage between programming voltage +Vp applied to N-well 200, and 0 V, for example ground applied to bit line BL, may be induced to floating gate FG. In embodiments, a P metal oxide semiconductor (PMOS) transistor of word line WL and a PMOS transistor of floating gate FG may be substantially simultaneously turned on. In embodiments, current may flow from common source CS of PMOS transistor of word line WL to bit line BL drain of PMOS transistor of floating gate FG. In embodiments, hot electrons produced in the vicinity of a drain junction region of PMOS transistor of floating gate FG may be injected into floating gate FG. In embodiments, a threshold voltage of PMOS transistor of floating gate FG may be minimized.

Figure 5:
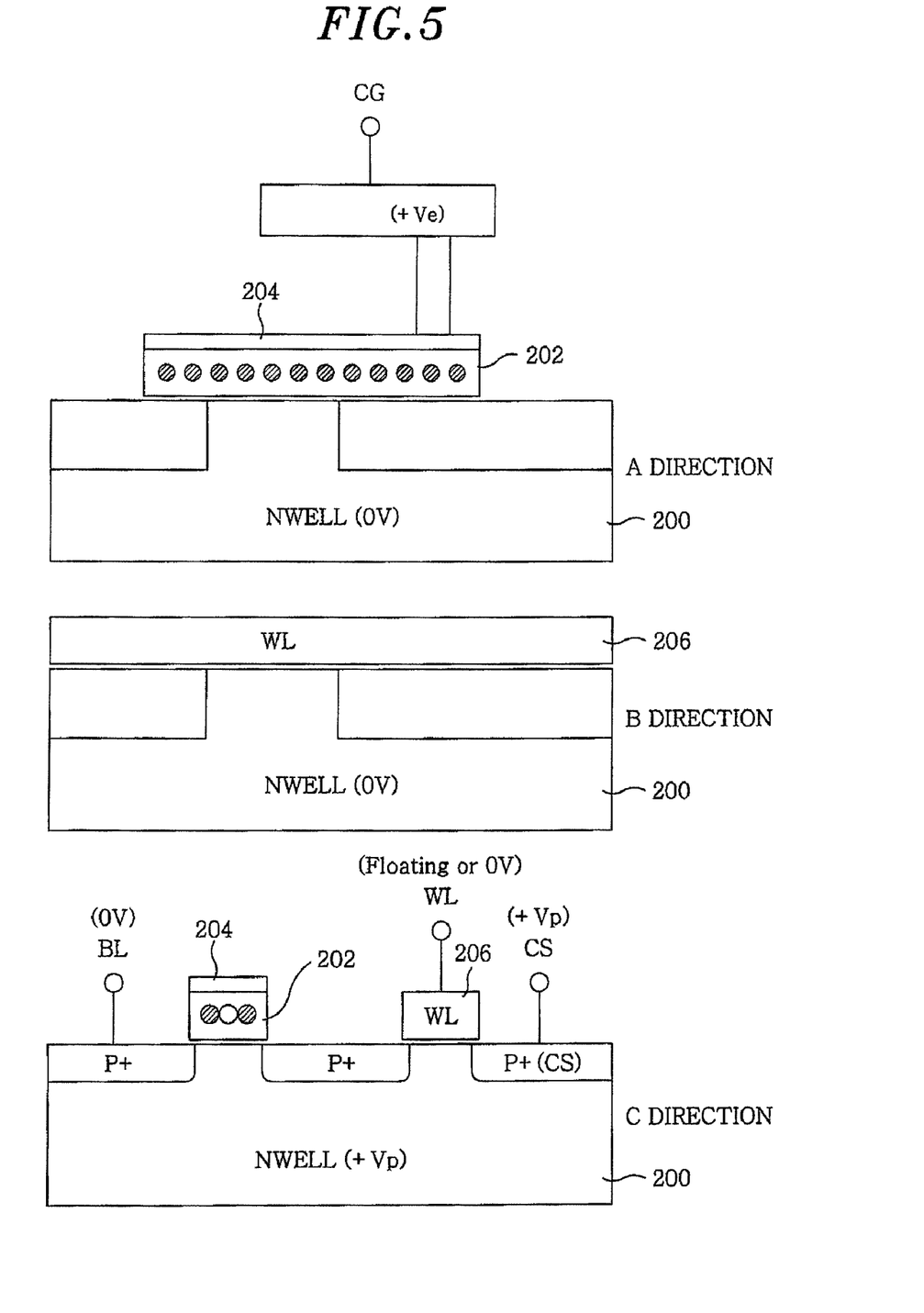
FIG. 5 is a view illustrating an erase scheme in a single poly EEPROM in accordance with embodiments.

Referring to example FIG. 5, a view illustrates a method of erasing a single poly EEPROM cell in accordance with embodiments. According to embodiments, word line WL may be floated and/or grounded, for example at approximately 0 V. In embodiments, erase voltage +Ve may be applied to control gate CG. In embodiments, remaining terminals, for example N-well 200, word line WL and/or common source CS, may be grounded, for example at approximately 0 V. In embodiments, an area of a capacitor formed on and/or over a floating gate and/or under a line contact of control gate CG may be relatively very small relative to an area formed between floating gate FG, N-well 200 and/or a source/drain. In embodiments, capacitance between floating gate FG and control gate CG line contact may be relatively very small. In embodiments, a potential induced to floating gate FG may depend on a potential applied to N-well 200 and/or a source/drain.

According to embodiments, a potential of floating gate FG may be coupled by approximately 0 V, for example ground, applied to N-well 200 and/or by approximately 0 V applied to bit line BL. In embodiments, an approximate 0 V potential may be induced to floating gate FG irrespective of erase voltage +Ve applied to control gate CG. In embodiments, a relatively high electric field may be formed between floating gate FG and a contact of control gate CG. In embodiments, a formed relatively high electric field may allow electrons existing in a floating gate to FG F/N-tunnel a dielectric and escape into a contact of control gate CG. In embodiments, threshold voltage of a PMOS transistor may be maximized.

Figure 6:
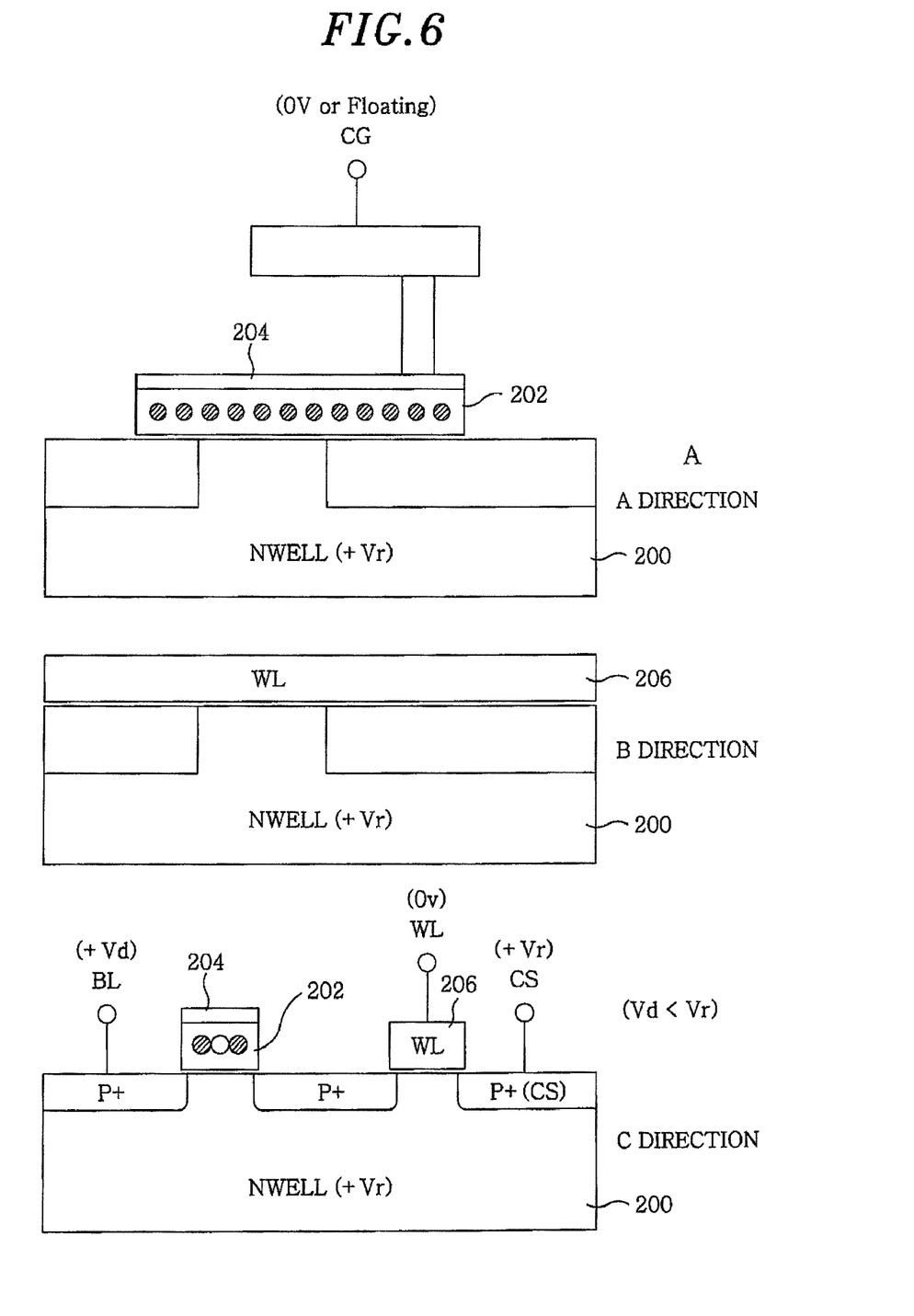
FIG. 6 is a view illustrating a read scheme in a single poly EEPROM in accordance with embodiments.

Referring to example FIG. 6, a view illustrates a method of reading a single poly EEPROM cell in accordance with embodiments. According to embodiments, control gate CG may be grounded, for example at approximately 0 V, and/or floated. In embodiments, read voltage +Vr may be applied to N-well 200 and/or common source CS. In embodiments, word line WL may be grounded, for example at approximately 0 V. In embodiments, drain voltage +Vd may be applied to bit line BL. In embodiments, read voltage +Vr applied to N-well 200 and/or common source CS may be set to be larger than drain voltage +Vd applied to bit line BL.

According to embodiments, in a programmed state, for example a state where electrons may be injected in floating gate FG, a threshold voltage of a PMOS transistor may be relatively low such that a PMOS transistor may be turned on, and/or current may flows from common source CS to bit line BL. In embodiments, in an erased state, for example a state where substantially no electrons exist in a floating gate FG, a threshold voltage of a PMOS transistor may be relatively high such that a PMOS transistor may be turned off, and/or substantially no current may flow from common source CS to bit line BL.

Figure 7:
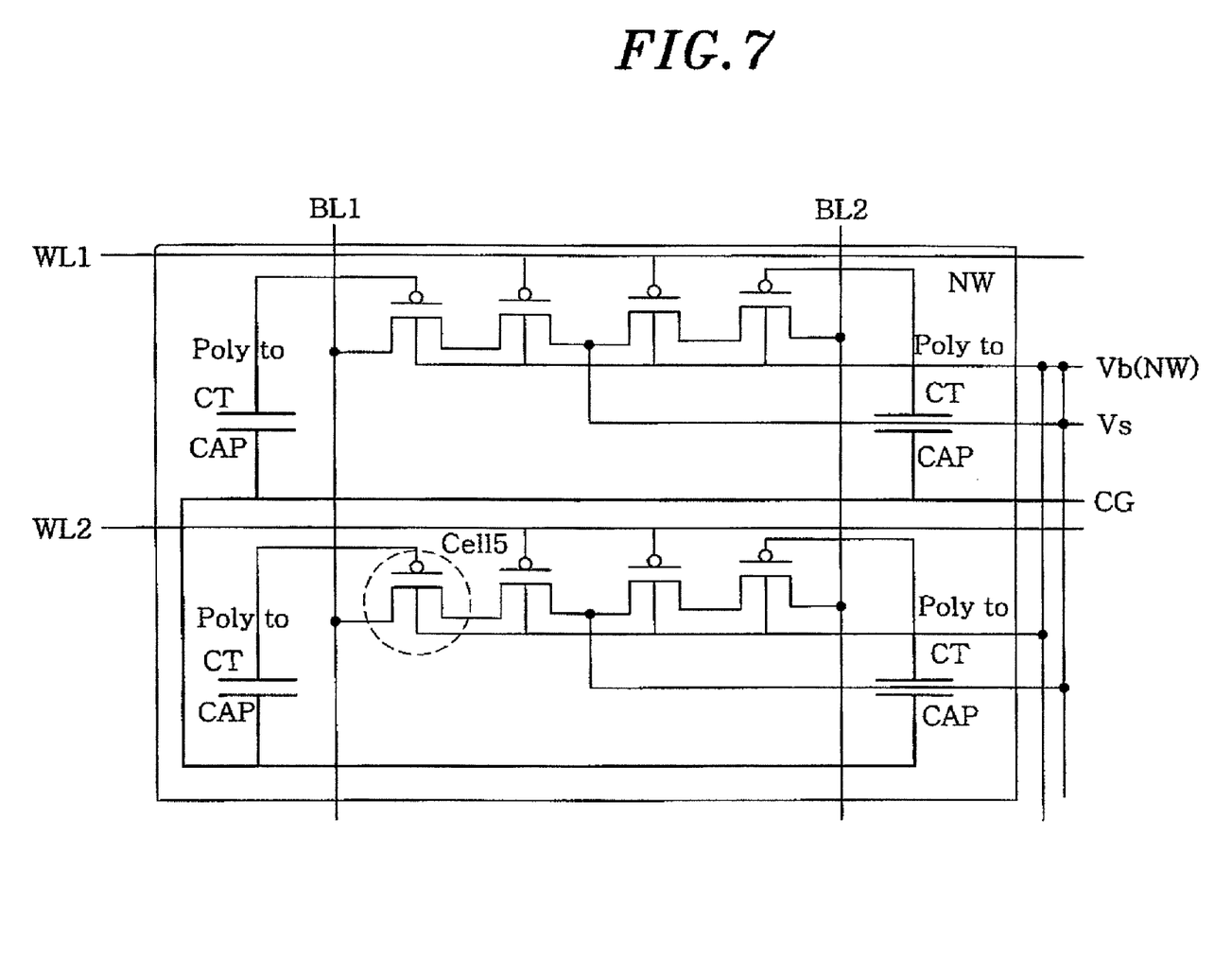
FIG. 7 is a view illustrating a NOR flash type array of a single poly EEPROM in accordance with embodiments.
Figure 8:
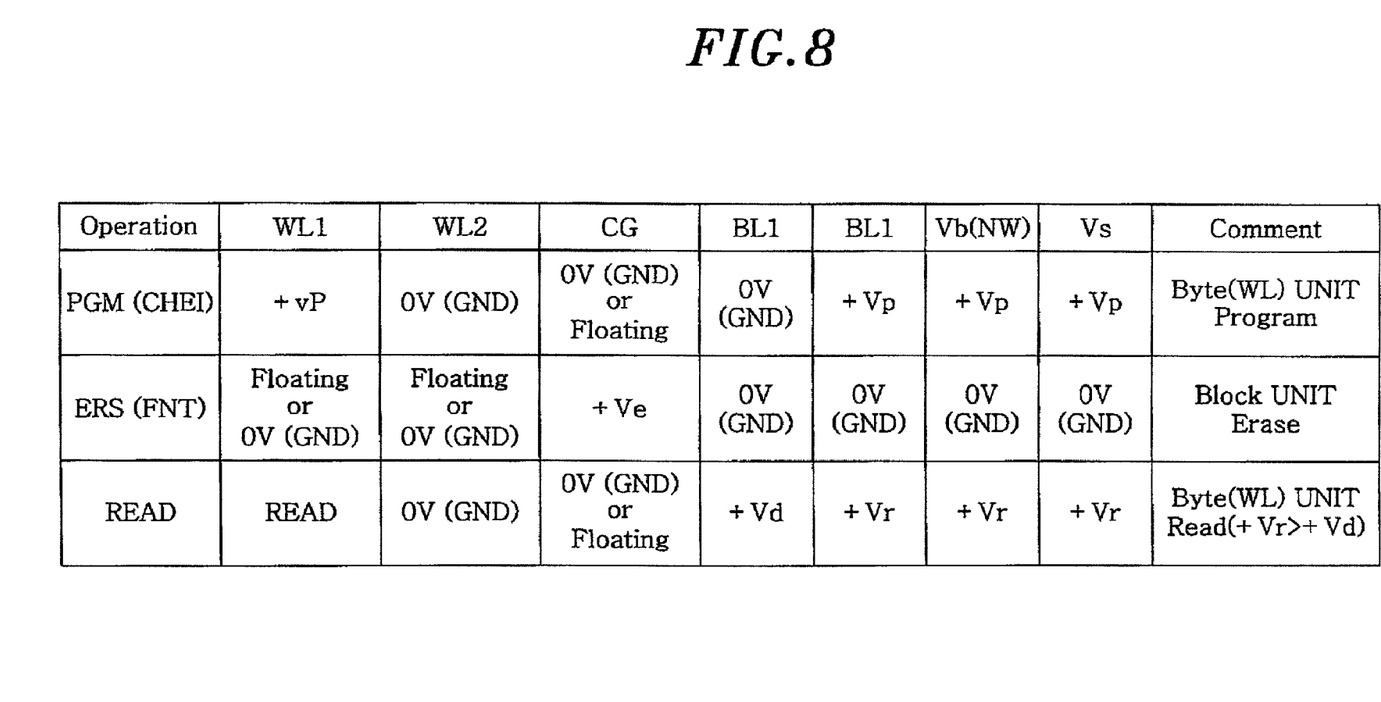
FIG. 8 is a table illustrating bias conditions of a NOR flash type array illustrated in FIG. 7 in accordance with embodiments.

Referring to example FIG. 7, a view illustrates a NOR flash type array of single poly EEPROM cells in accordance with embodiments. In embodiments, cell 5 may be selectively programmed, for example. In embodiments, cells may be erased at once in the unit of block and/or page. In embodiments, cell 5 may be selectively read. Referring to example FIG. 8, bias conditions may be provided. In embodiments, programming in a unit of byte, reading in unit of byte, and/or erasing in a unit of block and/or page operations may be performed by applying a bias. In embodiments, an, N-well and/or a common source may be separated into different lines, and/or may be integrated into one line.

According to embodiments, for example in a single poly EEPROM cell structure, a cell size may be scaled by forming a contact to couple on and/or over a floating gate polysilicon. In embodiments, a dielectric film may be formed to couple, and may be between a contact and a floating gate polysilicon. In embodiments, coupling may be performed through a floating gate polysilicon and a contact. In embodiments, a method of performing programming, erasing and/or reading operations in a semiconductor memory cell may include a floating gate polysilicon and/or a dielectric to couple, which may be formed between a contact a floating gate polysilicon.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising at least one of:
   providing a floating gate over a semiconductor substrate including an N-well region and below a bit line, a word line below said floating gate, a common source below said word line, and a control gate connected to said floating gate by a contact through a dielectric;
   programming by applying a preset programming voltage to said common source and said N-well region, at least one of grounding and floating said control gate, and grounding said word line and the bit line;
   erasing by at least one of floating and grounding said word line, applying a preset erase voltage to said control gate, and grounding said N-well, said bit line and said common source; and
   reading by at least one of grounding and floating said control gate, applying a preset read voltage to said N-well and said common source, grounding said word line, and applying a preset drain voltage to said bit line.

2. The method of claim 1, wherein a voltage between said preset programming voltage applied to said N-well in said programming and a ground voltage applied to said bit line is induced to said floating gate.

3. The method of claim 1, wherein said erasing comprises a potential of said floating gate coupled by a ground voltage applied to said N-well and a ground voltage applied to said bit line.

4. The method of claim 1, wherein a programmed reading state comprises current induced from said common source to said bit line.

5. The method of claim 1, wherein a programmed erasing state comprises substantially no current induced from said common source to said bit line.

6. The method of claim 1, comprising providing a semiconductor memory cell.

* * * * *